United States Patent
Schneider et al.

(10) Patent No.: US 6,417,722 B1
(45) Date of Patent: Jul. 9, 2002

(54) SENSE AMPLIFIER CONFIGURATION HAVING A FIELD-EFFECT TRANSISTOR HAVING A SHORT CHANNEL LENGTH AND AN ADJUSTABLE THRESHOLD VOLTAGE

(75) Inventors: Helmut Schneider, München; Jürgen Lindolf, Friedberg; Thomas Borst, Neubiberg; Hermann Ruckerbauer, Moos, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/525,820

(22) Filed: Mar. 15, 2000

(30) Foreign Application Priority Data

Mar. 15, 1999 (DE) .......................................... 199 11 463

(51) Int. Cl.$^7$ ...................... H01L 29/772; H01L 27/085
(52) U.S. Cl. ........................ 327/534; 327/564; 257/350
(58) Field of Search ................................ 257/350, 371, 257/391, 500, 544; 327/534, 535, 537, 564, 581, 427, 434

(56) References Cited

U.S. PATENT DOCUMENTS

| | | | | |
|---|---|---|---|---|
| 5,397,934 A | * | 3/1995 | Merrill et al. | 327/537 |
| 5,838,047 A | * | 11/1998 | Yamauchi et al. | 327/537 |
| 6,008,669 A | | 12/1999 | Gerner | 326/87 |
| 6,097,243 A | * | 8/2000 | Bertin et al. | 327/544 |
| 6,218,895 B1 | * | 4/2001 | De et al. | 257/299 |
| 6,225,852 B1 | * | 5/2001 | Cleveland et al. | 327/534 |
| 6,242,969 B1 | * | 6/2001 | Sher | 327/525 |
| 6,249,027 B1 | * | 6/2001 | Burr | 257/350 |

FOREIGN PATENT DOCUMENTS

| | | | |
|---|---|---|---|
| EP | 0 006 428 A2 | 1/1980 | H01L/27/02 |
| EP | 0 814 513 A2 | 12/1997 | H01L/27/092 |
| JP | 7-235608 | 9/1995 | H01L/21/8238 |

* cited by examiner

Primary Examiner—Terry D. Cunningham
Assistant Examiner—Terry L. Englund
(74) Attorney, Agent, or Firm—Laurence A. Greenberg; Werner H. Stemer; Ralph E. Locher

(57) ABSTRACT

A sense amplifier configuration includes a semiconductor substrate, a well having a variable well potential and insulated in the semiconductor substrate, and at least one field-effect transistor in the well. The transistor has a short channel length and an adjustable threshold voltage. Locating the field-effect transistor in an insulated well with a controllable potential allows for compensation of deviations in the threshold voltage with the substrate control effect. The threshold voltage can increase with increasingly larger negative voltage values of the well potential. The threshold voltage has an actual value and a target value, and the well potential can be controlled as a function of a difference between the actual and target threshold voltage values. The well potential can vary from approximately +200 mV to −400 mV, and in steps of approximately 50 mV. The field-effect transistor has a switched-off state, and the well potential can be different from an active potential in the switched-off state of the field-effect transistor, preferably, the well potential is 0 V in the switched-off state. The field-effect transistor can be a plurality of field-effect transistors all disposed in the well. The semiconductor substrate, the well, and the field-effect transistor can be fabricated by ion implantation.

9 Claims, 1 Drawing Sheet

SENSE AMPLIFIER CONFIGURATION HAVING A FIELD-EFFECT TRANSISTOR HAVING A SHORT CHANNEL LENGTH AND AN ADJUSTABLE THRESHOLD VOLTAGE

BACKGROUND OF THE INVENTION

Field of the Invention

The invention lies in the field of semiconductors. The invention relates to a sense amplifier configuration including a field-effect transistor, provided in a semiconductor substrate, with a short channel length and an adjustable threshold voltage.

The increasing integration density in integrated circuits is inevitably associated with a reduction in the dimensions of transistors. The transistor dimension reduction leads to shorter and shorter channel lengths when the transistors are field-effect transistors. Field-effect transistors having reduced channel lengths are also referred to as short-channel transistors.

However, such short-channel transistors exhibit a considerable disadvantage during operation, i.e., they have a pronounced "roll-off" behavior, meaning that the threshold voltage falls to a greater or lesser extent as the channel or gate length decreases. Even relatively slight fluctuations in the gate length that can be attributed to altered mask prestresses, for example, bring about a comparatively large change in the threshold voltage. In other words, the further the channel or gate length of field-effect transistors is reduced, the greater the effect of slight fluctuations in the channel or gate length on the threshold voltage. Thus, if the channel or gate length of the field-effect transistors is reduced further, values sought for the threshold voltage can be accurately adhered to only with very great difficulty.

In the case of sense amplifiers, the "roll-off" behavior of the short-channel transistors is particularly disadvantageous because the sense speed thereof depends appreciably on the voltage difference between a signal to be read and the threshold voltage of the corresponding field-effect transistor of the sense amplifier, also referred to as "overdrive".

In order to prevent a pronounced "roll-off" behavior and to realize a sense amplifier with sufficient "overdrive", the sense amplifier has heretofore been configured to ensure an adequate margin for accommodating process fluctuations. However, the provision of such a margin is a fundamental obstacle to the generally sought goal of miniaturization.

SUMMARY OF THE INVENTION

It is accordingly an object of the invention to provide a sense amplifier configuration including a field-effect transistor with a short channel length and an adjustable threshold voltage that overcomes the hereinafore-mentioned disadvantages of the heretofore-known devices of this general type and that allows the setting of a defined threshold voltage even when short-channel transistors are used.

With the foregoing and other objects in view, there is provided, in accordance with the invention, a sense amplifier configuration including a semiconductor substrate, a well having a variable well potential and insulated in the semiconductor substrate, and at least one field-effect transistor in the well, the at least one transistor having a short channel length and an adjustable threshold voltage.

Thus, field-effect transistors configured as short-channel transistors are provided in wells. The wells are respectively insulated from one another and have a variable potential. By appropriately adjusting the well potential, it is readily possible to compensate for deviations of an actual threshold voltage from a target value thereof with the substrate control effect. Compensation is possible because increasing negative voltage values of the well potential allow the threshold voltage of a field-effect transistor to rise given the same channel or gate length, thereby enabling the threshold voltage to be brought to a desired target value by the well potential with the aid of the substrate control effect. It is thus possible to optimize the sense speed of the sense amplifier.

The adjustment of the well potential can be performed by a fuse, for example, which then feeds a specific voltage to the well if the deviation between the actual threshold voltage and the target value thereof exceeds a specific threshold. However, it is also possible for the well potential to be adjusted in an autoadaptive control loop such that the threshold voltage of the field-effect transistor corresponds to its target value.

Suitable values for the voltage for the adjustment of the well potential may be, for example, between +200 mV to −400 mV, where adjustment in steps of 50 mV may be possible. In order to save current, it may be expedient to set a well potential that is different from the active potential in the switched-off state of the transistor. Preferably, the active potential in the switched-off state of the transistor is 0 V.

In accordance with another feature of the invention, the threshold voltage increases with increasingly larger negative voltage values of the well potential.

In accordance with a further feature of the invention, the threshold voltage has an actual value and a target value, and the well potential is controlled as a function of a difference between the actual threshold voltage value, and the target threshold voltage value.

In accordance with an added feature of the invention, the well potential varies from approximately +200 mV to −400 mV.

In accordance with an additional feature of the invention, the well potential varies in steps of approximately 50 mV.

In accordance with yet another feature of the invention, the at least one field-effect transistor has an active potential and a switched-off state, and the well potential is different from said active potential in the switched-off state of the at least one field-effect transistor.

In accordance with yet a further feature of the invention, the well potential is 0 V in the switched-off state.

Configurations in which a plurality of transistors of a sense amplifier are located in the same well are also possible. In accordance with yet an added feature of the invention, the at least one field-effect transistor is a plurality of field-effect transistors all disposed in the well.

In accordance with a concomitant feature of the invention, the semiconductor substrate, the well, and the at least one field-effect transistor are fabricated by ion implantation.

Other features that are considered as characteristic for the invention are set forth in the appended claims.

Although the invention is illustrated and described herein as embodied in a sense amplifier configuration including a field-effect transistor with a short channel length and an adjustable threshold voltage, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the follow-

DESCRIPTION OF THE PREFERRED EMBODIMENTS

Figure 1:
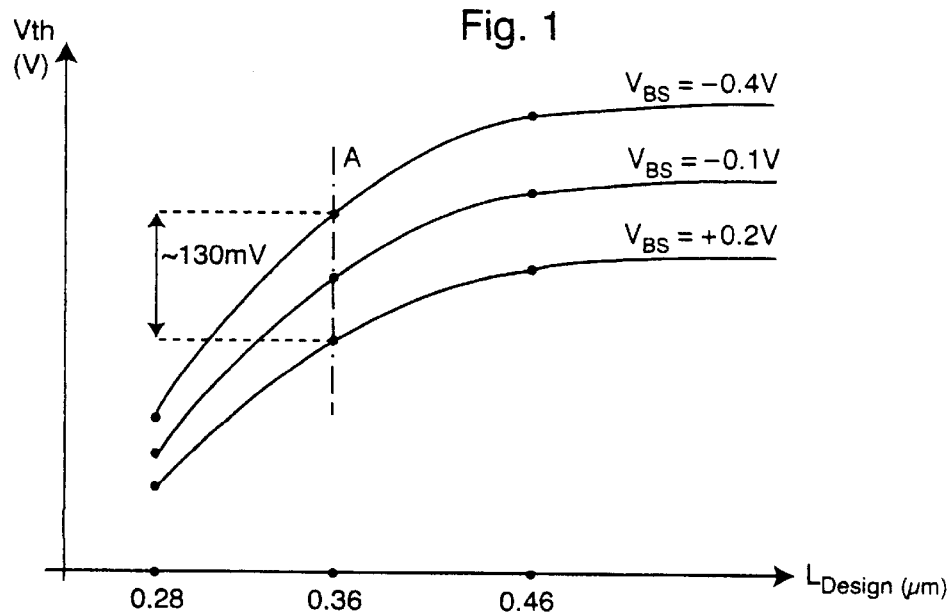
FIG. 1 is a characteristic curve diagram for determining the dependence of a threshold voltage Vth (Volts) on a dimension or channel length $L_{Design}$ (μm) with a well potential $V_{BS}$ as the parameter according to the invention.

In all the figures of the drawing, sub-features and integral parts that correspond to one another bear the same reference symbol in each case.

Referring now to the figures of the drawings in detail and first, particularly to FIG. 1 thereof, there is shown the dependence of the threshold voltage Vth (in V) on the dimension or channel or gate length $L_{Design}$ (μm) for a field-effect transistor. Depending on the well potential defined by a bulk(semiconductor body)-source voltage $V_{BS}$, different values for the threshold voltage Vth result for the same dimension $L_{Design}$. For example, a variable operating point A that fluctuates in a range of approximately 130 mV results when 0.36 μm is taken as the channel or gate length. Thus, as the voltage $V_{BS}$ becomes more and more negative, the operating point A drifts to higher values of Vth. The effect produces the observation that the threshold voltage increases with increasingly larger negative voltage values of the well potential. A channel or gate length $L_{Design}$ is in a range between 0.2 and 0.6 μm, preferably between 0.25 and 0.50 μm.

As shown in FIG. 1, the voltage $V_{BS}$ may be altered for example in a variable manner from +200 mV to −400 mV in steps of 50 mv, for example, in order to obtain, for the given dimension $L_{Design}$, a threshold voltage Vth that is the closest to the target value sought for the threshold voltage.

Preferably, the voltage $V_{BS}$=0 V is assigned to a switched-off state of the field-effect transistor in order to contribute towards saving current.

Figure 2:
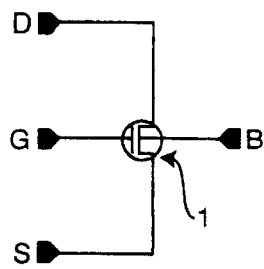
FIG. 2 is a circuit diagram of a transistor according to the invention.

FIG. 2 schematically shows a field-effect transistor 1 with a drain D, a gate G, and a source S. Additionally provided is a terminal B ("bulk") for application of the well potential. The voltage $V_{BS}$ is fed through terminal B to the well of the field-effect transistor 1, and leads to the desired threshold voltage Vth.

Figure 3:
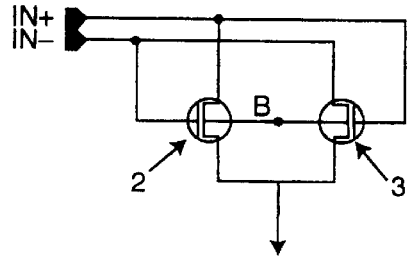
FIG. 3 is an embodiment of a circuit diagram including the circuit of FIG. 2.

FIG. 3 shows a circuit diagram with two field-effect transistors 2, 3 with a common well. A variable potential is present at the terminal B, and the field-effect transistors 2, 3 are connected to inputs IN+ and IN-.

Figure 4:
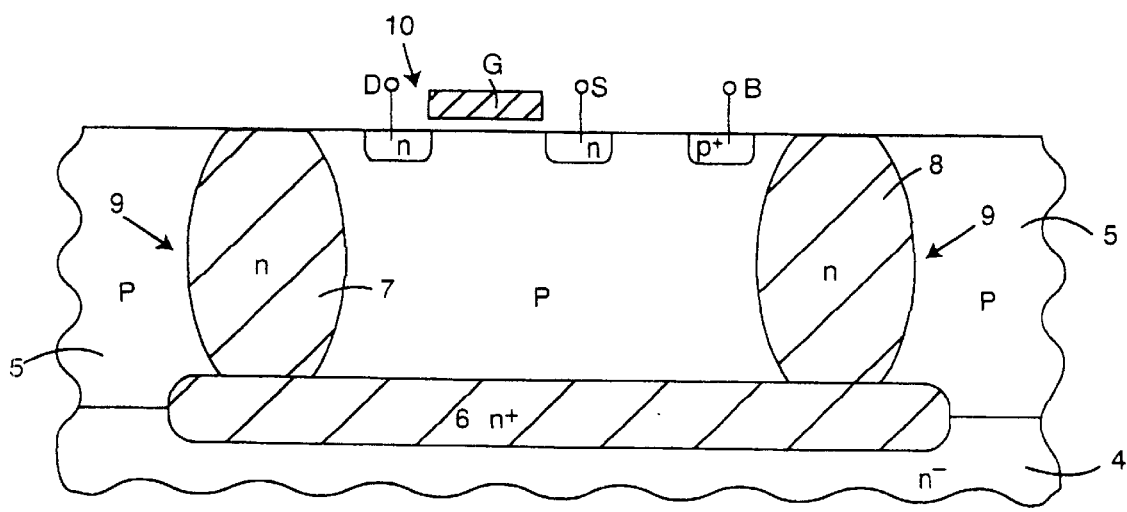
FIG. 4 is a fragmentary diagrammatic cross section through a field-effect transistor with an insulated well according to the invention.

FIG. 4 shows a section through a field-effect transistor with an insulated well. A p-conducting epitaxial layer 5 is disposed on an N⁻-conducting semiconductor substrate, an n⁺-conducting buried layer 6 is provided between the semiconductor substrate 4 and the epitaxial layer 5. Together with the n-conducting diffusion regions 7, 8, the buried layer 6 forms a well 9 that insulates a field-effect transistor 10 disposed within the well 9 and having an n-conducting drain D, an n-conducting source S, and a gate G made of polycrystalline silicon from other components. A p⁺-conducting zone has a terminal B. A well potential is fed to the field-effect transistor 10 through terminal B by impressing the voltage $V_{BS}$ such that the field-effect transistor 10 has the desired threshold voltage Vth. Preferably, the potential has a 0 V value in the switched-off state.

A structure of the kind shown in FIG. 4 can be fabricated by ion implantation, for example.

For the structure of FIG. 4, the well potential fed through the terminal B may be controlled as a function of the actual threshold voltage and the target value of the threshold voltage, for example, ultimately as a function of the difference between the actual threshold voltage and the target value thereof. For the structure, control is also possible by "automatically" setting the well potential present at the terminal B to a value that causes the threshold voltage Vth to attain its target value.

If appropriate, it is also possible for a plurality of field-effect transistors of a sense amplifier to be located in the well 9.

We claim:

1. A sense amplifier configuration, comprising:

a semiconductor substrate;

a well having a variable well potential and insulated in said semiconductor substrate, said well potential varying from substantially +200 mV to −400 mV; and at least one field-effect transistor in said well, said at least one transistor having a short channel length and an adjustable threshold voltage.

2. The sense amplifier configuration according to claim 1, wherein said threshold voltage increases with increasingly larger negative voltage values of said well potential.

3. The sense amplifier configuration according to claim 1, wherein said threshold voltage h as an actual value and a target value, and said well potential is controlled as a function of a difference between said actual threshold voltage value and said target threshold voltage value.

4. The sense amplifier configuration according to claim 1, wherein said well potential varies in steps of approximately 50 mV.

5. The sense amplifier configuration according to claim 1, wherein said at least one field-effect transistor has an active potential and a switched-off state, and said well potential is different from said active potential in said switched-off state of said at least one field-effect transistor.

6. The sense amplifier configuration according to claim 5, wherein said well potential is 0 V in said switched-off state.

7. The sense amplifier according to claim 1, wherein said at least one field-effect transistor is a plurality of field-effect transistors all disposed in said well.

8. The sense amplifier configuration according to claim 1, wherein said semiconductor substrate, said well, and said at least one field-effect transistor are fabricated by ion implantation.

9. A sense amplifier configuration, comprising:

a semiconductor substrate;

a well having a variable well potential and insulated in said semiconductor substrate, said well potential varying from substantially +200 mV to −400 mV in steps of substantially 50 mV; and at least one field-effect transistor in said well, said at least one transistor having a short channel length and an adjustable threshold voltage.

\* \* \* \* \*